United States Patent
Graziosi et al.

(10) Patent No.: US 11,915,989 B2
(45) Date of Patent: Feb. 27, 2024

(54) SEMICONDUCTOR DEVICE AND CORRESPONDING MANUFACTURING METHOD

(71) Applicant: STMicroelectronics S.r.l., Agrate Brianza (IT)

(72) Inventors: Giovanni Graziosi, Vimercate (IT); Aurora Sanna, Milan (IT); Riccardo Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 177 days.

(21) Appl. No.: 17/573,339

(22) Filed: Jan. 11, 2022

(65) Prior Publication Data
US 2022/0238405 A1    Jul. 28, 2022

(30) Foreign Application Priority Data
Jan. 25, 2021 (IT) .......................... 102021000001301

(51) Int. Cl.
| | |
|---|---|
| *H01L 23/31* | (2006.01) |
| *H01Q 1/22* | (2006.01) |
| *H01L 23/538* | (2006.01) |
| *H01L 23/66* | (2006.01) |

(52) U.S. Cl.
CPC ...... *H01L 23/3114* (2013.01); *H01L 23/5389* (2013.01); *H01L 23/66* (2013.01); *H01Q 1/2283* (2013.01); *H01L 2223/6677* (2013.01)

(58) Field of Classification Search
CPC .......................... H01Q 1/2283; H01Q 23/3114
See application file for complete search history.

(56) References Cited

U.S. PATENT DOCUMENTS

| | | | | |
|---|---|---|---|---|
| 8,058,714 B2 * | 11/2011 | Noll | ........................ | H01L 23/66 |
| | | | | 343/702 |
| 8,087,155 B2 | 1/2012 | Weste | | |
| 9,105,485 B2 * | 8/2015 | Tran | ........................ | H01L 24/05 |
| 9,583,842 B2 * | 2/2017 | Ganchrow | ............. | H01Q 21/28 |
| 11,316,252 B2 * | 4/2022 | Wu | ........................ | H01Q 1/2283 |
| 11,503,713 B2 * | 11/2022 | Kim | ........................ | H01Q 1/40 |
| 11,664,580 B2 * | 5/2023 | Yen | ........................ | H01L 24/97 |
| | | | | 343/873 |
| 11,784,143 B2 * | 10/2023 | Koller | ................... | H01L 21/565 |
| | | | | 257/428 |

(Continued)

OTHER PUBLICATIONS

EP Search Report and Written Opinion for family-related EP Appl. 22151920.0, report dated Jun. 3, 2022, 10 pgs.

(Continued)

*Primary Examiner* — Albert K Wong
(74) *Attorney, Agent, or Firm* — Crowe & Dunlevy (57) ABSTRACT

An antenna-in-package semiconductor device includes a semiconductor chip coupled to a planar substrate. An encapsulation body encapsulates the semiconductor chip. The encapsulation body includes a through cavity extending to the planar substrate. A rectilinear wire antenna is mounted within the through cavity and extends, for instance from the planar substrate, along an axis that is transverse to a surface of the planar substrate to which the semiconductor chip is coupled. The rectilinear wire antenna is electrically coupled to the semiconductor chip. An insulating material fills the cavity to encapsulated the rectilinear wire antenna.

28 Claims, 5 Drawing Sheets

(56) References Cited

U.S. PATENT DOCUMENTS

| | | | |
|---|---|---|---|
| 2006/0028378 A1* | 2/2006 | Gaucher | H01Q 1/2283 343/872 |
| 2009/0009405 A1 | 1/2009 | Rofougaran | |
| 2009/0272714 A1 | 11/2009 | Weste | |
| 2015/0145747 A1 | 5/2015 | Chung et al. | |
| 2018/0342453 A1 | 11/2018 | Ziglioli | |
| 2020/0203264 A1 | 6/2020 | Ziglioli | |
| 2020/0321274 A1 | 10/2020 | Magni | |
| 2022/0238405 A1* | 7/2022 | Graziosi | H01Q 1/2283 |
| 2023/0134737 A1* | 5/2023 | Herbsommer | H01Q 1/364 343/700 R |
| 2023/0145401 A1* | 5/2023 | Alpman | H05K 1/0218 343/700 MS |

OTHER PUBLICATIONS

IT Search Report and Written Opinion for priority application, IT 102021000001301, report dated Oct. 15, 2021, 10 pages.

Dowon, et al.: "A high-efficiency low-cost wire-bond loop antenna for CMOS wafers", 2009, IEEE International Symposium on Antennas Propagation USNC/URSI National Radio Science Meeting (2009) 4 pp.

Johannsen, et al.: "Bond-wires: Readily available integrated millimeter-wave antennas", 2012 42nd European Microwave Conference, Amsterdam, 2012, pp. 197-200.

Mitomo, et al.: "A 2-GB/s Throughput CMOS Transceiver Chipset With In-Package Antenna for 60-GHz Short-Range Wireless Communication", IEEE Journal of Solid-State Circuits, vol. 47, No. 12, Dec. 2012.

Ndip, et al.: "Modelling the shape, length and radiation characteristics of bond wire antennas", IET microwaves, antennas & propagation 6 (2012), Nr. 10, S.1187-1194.

Qin, Ivy, et al.: "Advances in Wire Bonding Technology for 3D Die Stacking and Fan Out Wafer Level Package," 2017 IEEE 67th Electronic Components and Technology Conference, pp. 1309-1315.

Tsutsumi, et al.: "Bonding wire loop antenna built into standard BGA package for 60 GHz short-range wireless communication", IEEE MTT-S International Microwave Symposium Digest. 1-4. 10.1109/MWSYM.2011.5972652.

Valenta, et al.: "Experimental Evaluation of Differential Chip-to-Antenna Bondwire Interconnects above 110 GHZ", 10.1109/EuMC 2014 6986608, 2014, 5 pp.

Varanasi, et al.: "On-chip bond-wire antennas on CMOS-grade silicon substrates", 2008 IEEE Antennas and Propagation Society International Symposium, San Diego, CA, 2008, pp. 1-4.

Zhang, et al.: Antenna-in-package for wirebond interconnection to highly-integrated 60-GHz radios, IEEE Transactions on Antennas and Propagation 57(10), 2842 2852.

* cited by examiner

SEMICONDUCTOR DEVICE AND CORRESPONDING MANUFACTURING METHOD

PRIORITY CLAIM

This application claims the priority benefit of Italian Application for Patent No. 102021000001301, filed on Jan. 25, 2021, the content of which is hereby incorporated by reference in its entirety to the maximum extent allowable by law.

TECHNICAL FIELD

The description relates to semiconductor devices including wire antennas.

One or more embodiments can be applied to millimeter-wave RF products operating at (very) high frequencies (70 GHz or higher) as expected to be increasingly used in the automotive sector or in consumer electronics (5G communication devices, for instance).

BACKGROUND

Antenna-in-Package (AiP) arrangements including one or more antennas integrated in a semiconductor device package are an area which has attracted increasing attention and investigation.

The following documents bear witness to the ever-increasing attention paid to that area of investigation:

Varanasi, et al.: "On-chip bond-wire antennas on CMOS-grade silicon substrates", 2008 IEEE Antennas and Propagation Society International Symposium, San Diego, CA, 2008, pp. 1-4;

Dowon, et al.: "A high-efficiency low-cost wire-bond loop antenna for CMOS wafers", 2009, IEEE International Symposium on Antennas Propagation USNC/URSI National Radio Science Meeting (2009) 4 pp.;

Zhang, et al.: "Antenna-in-package for wirebond interconnection to highly-integrated 60-GHz radios, IEEE Transactions on Antennas and Propagation 57(10), 2842-2852;

Mitomo, et al.: "A 2-Gb/s Throughput CMOS Transceiver Chipset With In-Package Antenna for 60-GHz Short-Range Wireless Communication", IEEE Journal of Solid-State Circuits, Vol. 47, No. 12, December 2012;

Ndip, et al.: "Modelling the shape, length and radiation characteristics of bond wire antennas", IET microwaves, antennas & propagation 6 (2012), Nr.10, S.1187-1194;

Johannsen, et al.: "Bond-wires: Readily available integrated millimeter-wave antennas", 2012 42nd European Microwave Conference, Amsterdam, 2012, pp. 197-200;

Valenta, et al.: "Experimental Evaluation of Differential Chip-to-Antenna Bondwire Interconnects above 110 GHz", 10.1109/EuMC 2014 6986608, 2014, 5 pp.;

QIN, Ivy, et al: "Advances in Wire Bonding Technology for 3D Die Stacking and Fan Out Wafer Level Package," 2017 IEEE 67th Electronic Components and Technology Conference, pages 1309-1315;

Tsutsumi, et al.: "Bonding wire loop antenna built into standard BGA package for 60 GHz short-range wireless communication", IEEE MTT-S International Microwave Symposium Digest. 1-4. 10.1109/MWSYM.2011.5972652; and U.S. Pat. No. 8,087,155 B2.

All of the foregoing documents are incorporated herein by reference.

The solutions discussed in the documents listed above mostly include loop wire bond antennas (in ball-grid-array or BGA packages, for instance), planar antennas (metal traces, for instance), or "dangling bond" antennas (see, U.S. Pat. No. 8,087,155).

The resulting arrangements are not particularly compact as desirable for various applications.

There is a need in the art to contribute in addressing the issues discussed in the foregoing.

SUMMARY

According to one or more embodiments relate to a semiconductor device.

A Quad-Flat No-Lead (QFN), a Ball-Grid-Array (BGA) or a Wafer Level Chip Scale Package (WLCSP) semiconductor device may be exemplary of such a device.

One or more embodiments may relate to a corresponding manufacturing method.

One or more embodiments facilitate integrating antennas in integrated circuit packages such as QFN, BGA and WLCSP packages.

One or more embodiments facilitate forming antenna-in-package arrangements using a vertical wire, such as wire bonded on a QFN lead or a redistribution layer (RDL) in a WLCSP package.

One or more embodiments provide good RF performance in terms of gain and radiation efficiency, also in view of the possibility of exploiting metallic parts in a semiconductor device package as ground planes and feed lines.

One or more embodiments facilitate compact implementations which may be advantageously applied to providing antenna arrays.

For instance, in a WLCSP package, one or more embodiments may involve drilling a cavity in a package molding compound (insulating encapsulation) next to a die or chip to expose a redistribution layer (RDL), forming a vertical wire in the cavity (by wire bonding technology, for instance), and filling the cavity with encapsulating material.

BRIEF DESCRIPTION OF THE DRAWINGS

One or more embodiments will now be described, by way of example only, with reference to the annexed figures, wherein.

It will be appreciated that, for the sake of simplicity and ease of explanation, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

It will be likewise appreciated that, unless the context indicates otherwise, like parts or elements are indicated throughout the figures with like reference symbols, and a detailed description will not be repeated for each and every figure for brevity.

Figure 1:
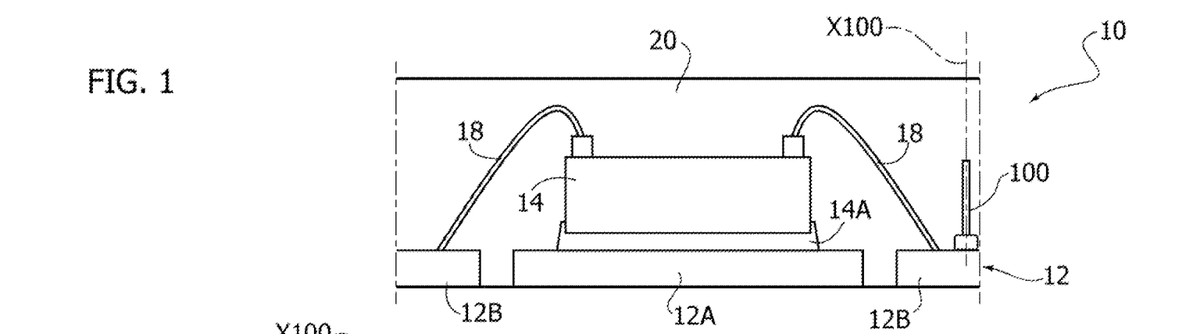
FIGS. 1 and 2 are cross-sectional views of Quad-Flat No-lead (QFN) semiconductor device packages comprising an antenna arranged on a leadframe according to embodiments of the present description.
Figures 2, 3:
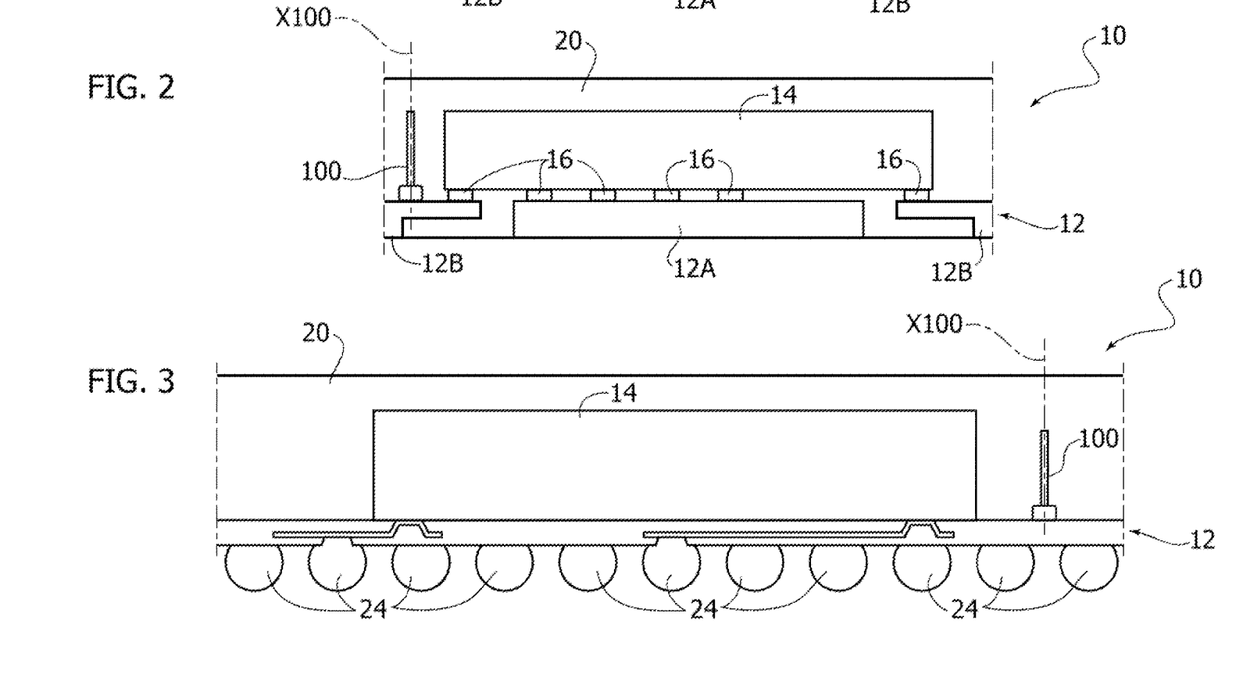
FIG. 3 is a cross-sectional view of a semiconductor device package comprising an antenna arranged on a redistribution layer (RDL) according to embodiments of the present description.

FIGS. 1 and 2 are cross-sectional views of Quad-Flat No-lead (QFN) semiconductor device packages 10.

These packages comprise, in a manner known per se to those of skill in the art, a leadframe 12 having arranged thereon one or more semiconductor chips or dice 14.

Only one chip or die 14 is illustrated here for simplicity.

The designation leadframe (or lead frame) is currently used (see, for instance the USPC Consolidated Glossary of the United States Patent and Trademark Office) to indicate a metal frame which provides (at a die pad or paddle 12A, for instance) support for a semiconductor chip or die 14 as well as electrical leads 12B to couple the semiconductor chip or die to 14 other electrical components or contacts.

Essentially, a leadframe as illustrated at reference 12 comprises an array of electrically-conductive formations (leads) 12B which from a peripheral location extend inwardly in the direction of the semiconductor chip or die 14, thus forming an array of electrically-conductive formations from the die pad 12A having at least one semiconductor chip or die attached thereon.

This may be via a die attach adhesive (a die-attach film (DAF), for instance) 14A—as illustrated in FIG. 1—or via (e.g., copper) pillars 16 grown on (the front or top surface of) the semiconductor chip or die 14—as illustrated in FIG. 2.

As illustrated in FIG. 1, electrical coupling of the leads 12B in the leadframe 12 with the semiconductor chip or die 14 may be via wires 18 forming a wire-bonding pattern around the chip or die 14.

As illustrated in FIG. 2, electrical coupling of the leads 12B in the leadframe 12 with the semiconductor chip or die 14 may be via some of the pillars 16 provided at the periphery of the front or top surface of) the semiconductor chip or die 14.

A device package as illustrated in FIGS. 1 and 2 is completed by an insulating encapsulation 20 providing an encapsulation body formed by molding a compound such as an epoxy resin on the leadframe 12 and the semiconductor chip(s) 14 attached thereon.

The possibility of providing electrical coupling of the leads 12B in the leadframe 12 with the semiconductor chip or die 14 by using laser direct structuring (LDS) technology has also been considered (see, for instance, United States Patent Publication Nos. 2018/0342453, 2020/0203264 or 2020/0321274, the disclosures of which are incorporated herein by reference).

Unless indicated otherwise in the following, semiconductor device architecture as discussed in the foregoing is conventional in the art, which makes it unnecessary to provide a more detailed description herein.

FIGS. 1 and 2 are exemplary of the possibility of realizing the semiconductor device package 10 as an antenna-in-package (AiP) device by providing (forming) therein a rectilinear "vertical" bonded wire antenna 100.

As used herein, "vertical" denotes the fact that the antenna extends along an antenna axis X100 in a direction transverse (that is, orthogonal or substantially orthogonal) to the "horizontal" plane of the planar substrate provided by the leadframe 12 (in other words, extending perpendicular to the main or top surface of the leadframe).

The terms "vertical" and "horizontal" refer to a device 10 oriented as illustrated in the figures; the orientation of the leadframe (substrate) 12 and the antenna 100 may thus vary (for instance in a device 10 mounted "on edge" the substrate 12 will be vertical and the antenna 100 horizontal) with the mutual "transverse" orientation of the antenna 100 to the plane of the sub state 12 maintained.

Metallic (electrically-conductive) formations in the substrate (pads and lines or tracks, not visible in the figures) provide ground planes and feed lines providing electrical coupling of the antenna 100 with the chip 14 for transmitting and/or receiving RF signals.

A rectilinear antenna 100 having a length (measured in the direction of the longitudinal antenna axis X100) comparable with (that is, approximately equal to or less than) the height or thickness of a conventional chip or die (e.g., approximately 300 to 500 um) was found to provide a 77 GHz gain peak of 5.39 dB and a 77 GHz radiation efficiency peak of −1.21 dB.

FIG. 3 is exemplary of the possibility of implementing an antenna-in-package (AiP) arrangement essentially similar to those of FIGS. 1 and 2 in a semiconductor device 10 comprising a semiconductor chip or die 14 coupled to a planar substrate 12 in the form of a redistribution layer (RDL).

The designation redistribution layer currently applies to a layer of wiring metal interconnections that redistribute input/output lines to parts of a chip. Such a redistribution layer facilitates coupling a chip 14 to a ball-grid array 24 for electrical connection to external circuitry (a printed circuit board (PCB), for instance, not visible in the figure).

Whatever the implementation details, a rectilinear wire antenna 100 as exemplified in FIGS. 1 to 3 can be realized by resorting to the vertical wire technology as discussed, e.g., in the paper by Qin, et al. (already cited herein) for providing vertical interconnections.

Also, it will be appreciated that, whatever the implementation details, a rectilinear wire antenna 100 as exemplified in FIGS. 1 to 3 will be ultimately protected by the encapsulation material 20 of the encapsulation body.

This facilitates the wire antenna 100 in maintaining its rectilinear shape as well as the desired orientation (for instance, "vertical", orthogonal to the support substrate 12).

Throughout the figures, rectilinear wire antennas 100 are illustrated which extend (protrude) from the substrate 12. It will be otherwise appreciated that, while not shown for the sake of brevity, in a semiconductor device as exemplified herein, one or more rectilinear wire antennas such as 100 may be arranged on a respective semiconductor chip (for instance, by being bonded to pads available at the top or front surface thereof).

For the sake of simplicity, all of the figures annexed illustrate individual device packages 10 comprising a single chip or die 14 coupled to a single rectilinear wire antenna 100.

It will be appreciated that one or more embodiments may in fact include: a single chip or die 14 coupled to a plurality of rectilinear wire antennas 100; plural chips or dice 14 coupled to a single rectilinear wire antenna 100; or plural chips or dice 14 coupled to a plurality of rectilinear wire antennas 100.

FIGS. 4A to 4M are exemplary of possible steps in a method of manufacturing a semiconductor device package 10 of the type exemplified in FIG. 3 in the exemplary case of manufacturing a Wafer Level Chip Scale Package (WLCSP) semiconductor device.

Those of skill in the art will otherwise appreciate that the sequence of steps of FIG. 4A to 4M is merely exemplary in so far as: a) one or more steps illustrated can be omitted (e.g., one or more wafer flipping steps can be omitted for certain package types) and/or replaced by other steps; b) additional steps may be added; and c) one or more steps can be carried out in a sequence different from the sequence illustrated.

Also, while exemplified in FIGS. 4A to 4M in connection with providing a wire antenna 100 in a semiconductor device package of the type exemplified in FIG. 3 (essentially a WLCSP) the steps related to providing the antenna 100 can be applied mutatis mutandis to providing a wire antenna 100 in semiconductor device packages 10 as exemplified in FIGS. 1 and 2.

Figure 4A:
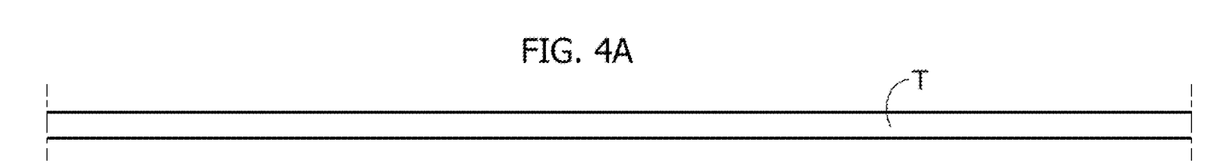
FIGS. 4A to 4M are exemplary of possible steps or acts in manufacturing semiconductor device package according to embodiments of the present description in the exemplary case of manufacturing a Wafer Level Chip Scale Package (WLCSP) semiconductor device.
Figure 4B:
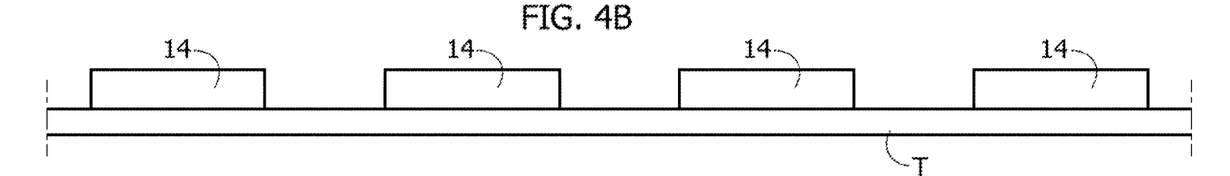
Figure 4C:
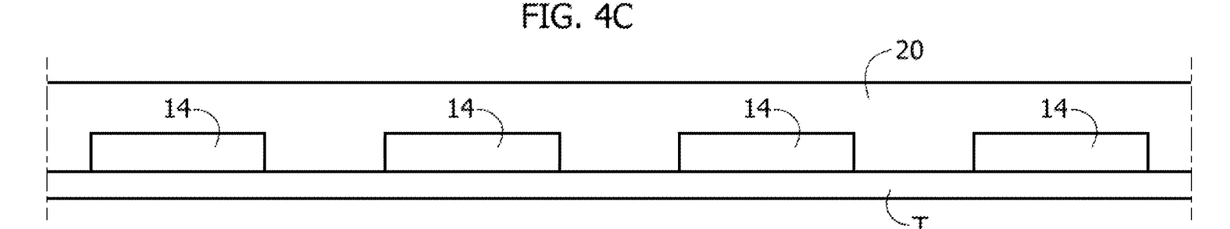
Figure 4D:
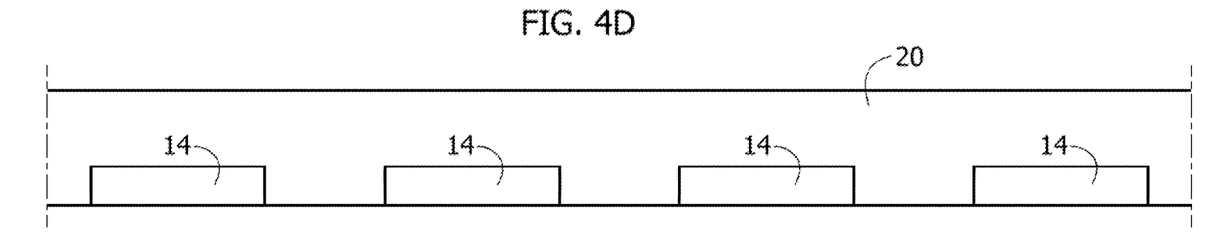
Figure 4E:
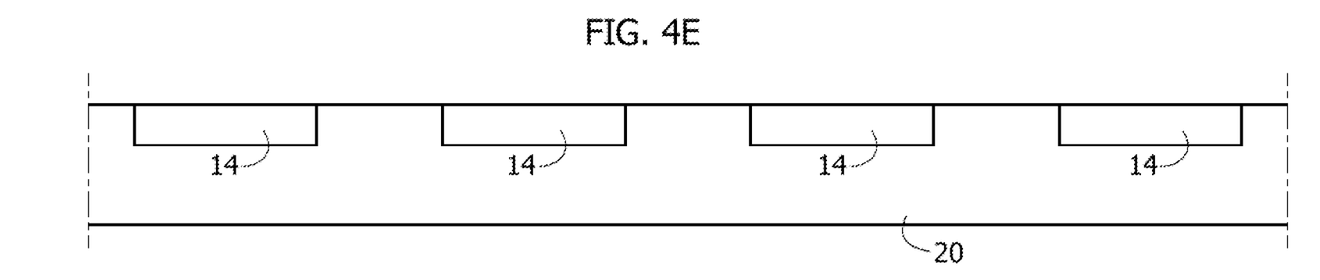
Figure 4F:
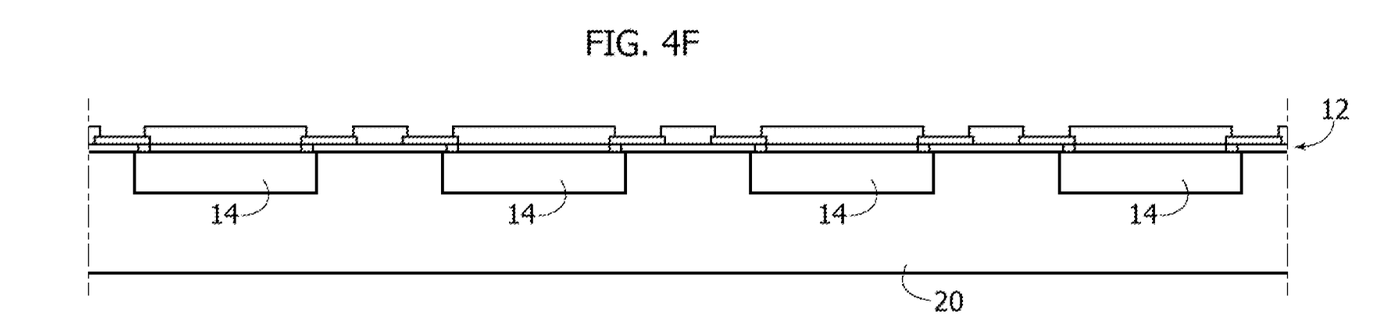
Figure 4G:
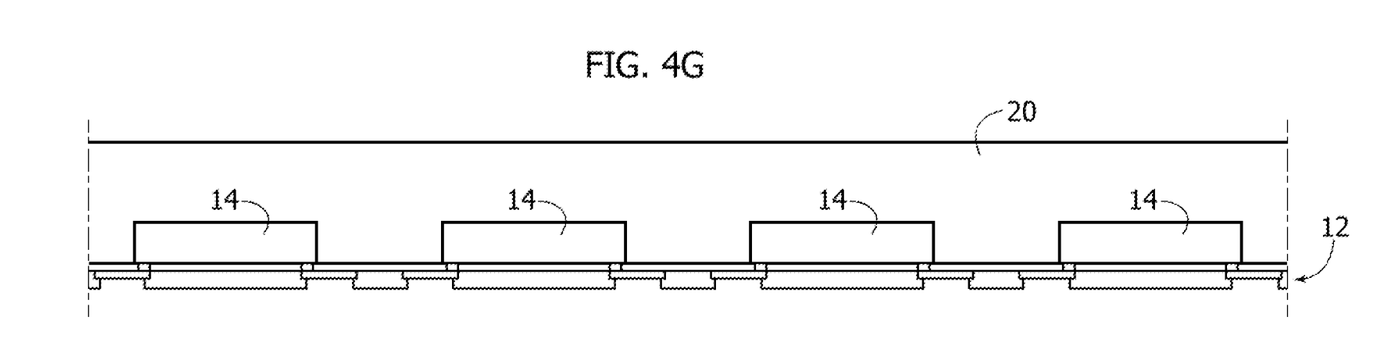
Figure 4H:
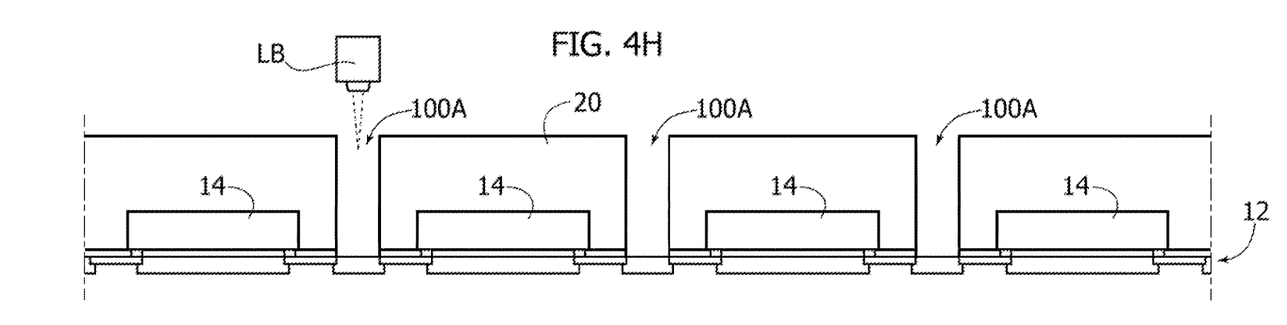
Figure 4I:
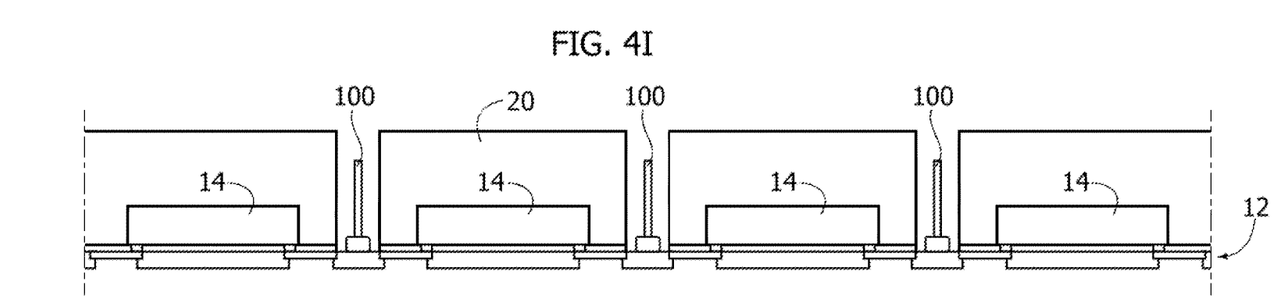
Figure 4J:
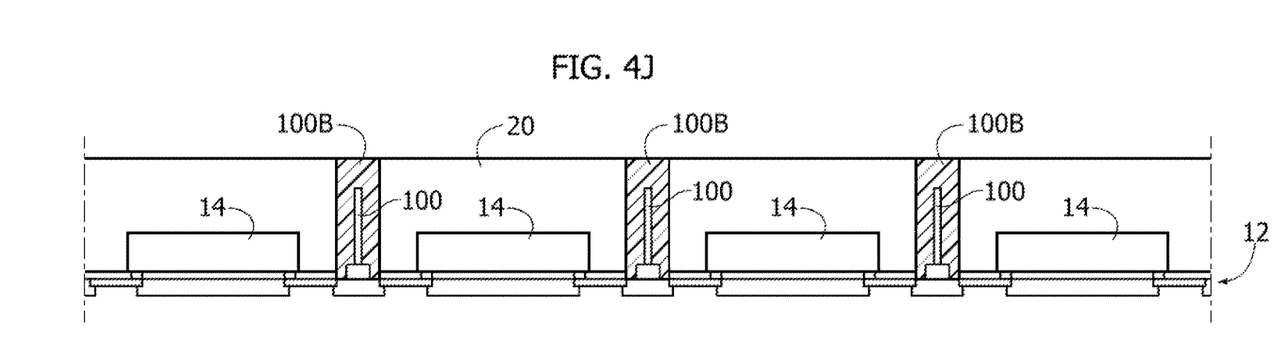
Figure 4K:
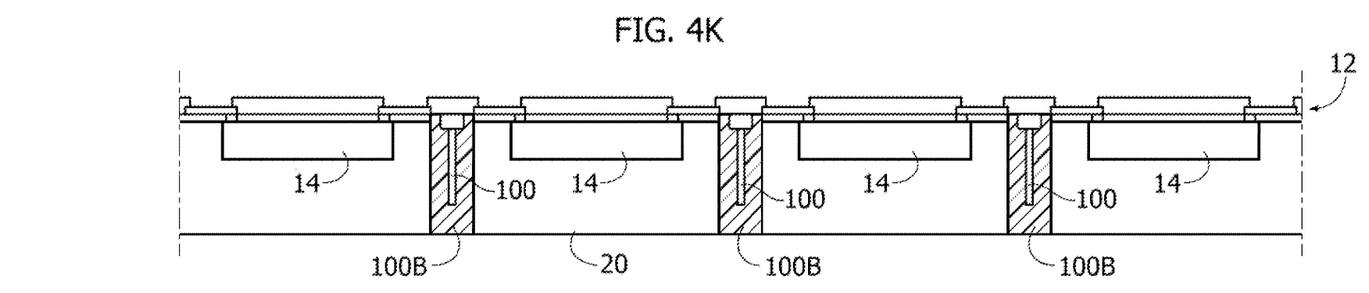
Figure 4L:
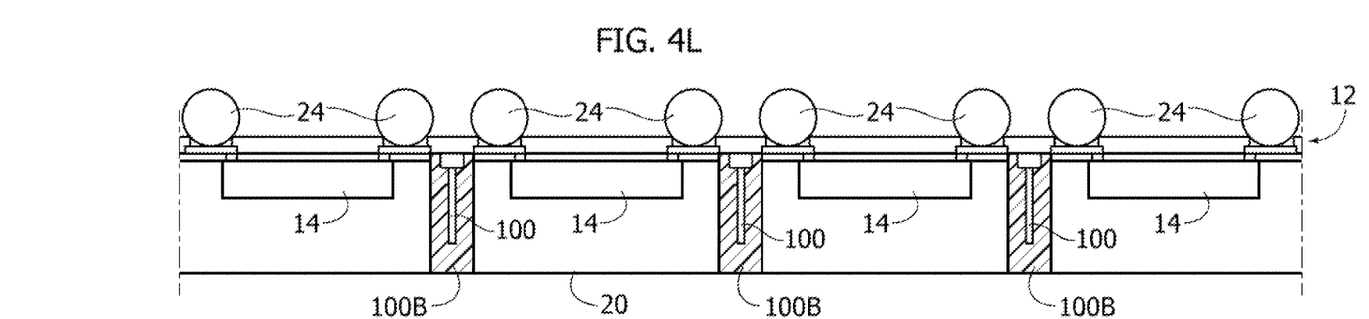
Figure 4M:
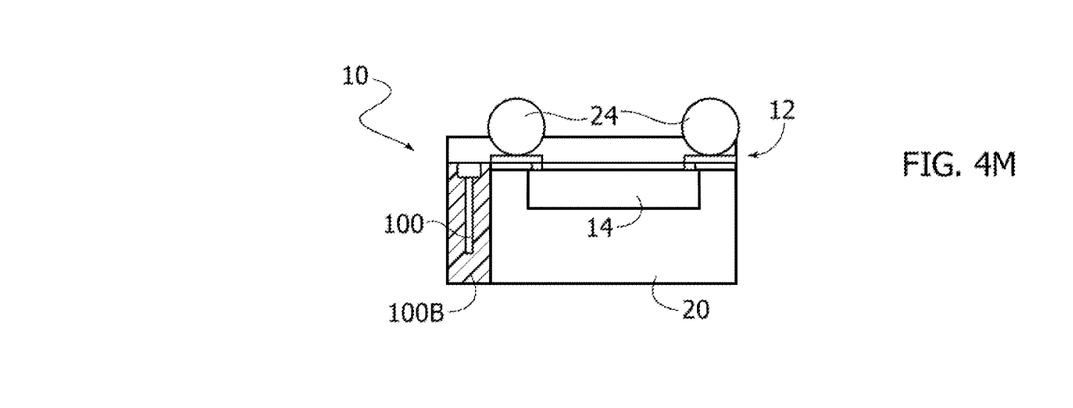

FIGS. 4A to 4M refer to manufacturing simultaneously plural devices 10 which are finally separated in a "singulation" step as represented in FIG. 4M as otherwise conventional in the art.

Also, for the sake of simplicity and ease of understanding, unless the context indicates otherwise: parts or elements like parts or elements already discussed in connection with FIGS. 1 to 3 are indicated in FIGS. 4A to 4M with like reference symbols, and a detailed description will not be repeated for brevity; and certain details possibly illustrated in FIGS. 1 to 3 are not reproduced for simplicity in FIGS. 4A to 4M.

The steps exemplified in FIGS. 4A to 4M are the following:

FIG. 4A—provision of a carrier tape T

FIG. 4B—placement of dice 14 (face down in the example illustrated)

FIG. 4C—molding of encapsulation material 20 (for subsequent formation of the encapsulation body)

FIG. 4D—removal of carrier tape T

FIG. 4E—flipping of wafer with dice 14 facing upward

FIG. 4F—provision of passivation/metallization/passivation layers (to provide a redistribution layer acting as a substrate 12), wherein the metallization is patterned to provide metal leads FIG. 4G—flipping of wafer FIG. 4H—laser drilling (via laser beam LB) through the encapsulation material 20 down to the metal leads of the redistribution layer (or leadframe) of the substrate 12 to provide (e.g., cylindrical) cavities 100A for hosting antennas 100

FIG. 4I—formation of antennas 100: this may involve resorting to conventional wire bonding apparatus implementing a "first bond" step (ball-plus-wire) to the substrate 12 at the bottom of the cavities 100A drilled in the encapsulation material 20 followed by vertical "capillary" withdrawal and cutting the wire at a desired controlled length for the antenna 100

FIG. 4J—filling of cavities 100A in the encapsulation material 20 having antennas 100 therein with a filling mass 100B of an insulating material (for instance, glob-top resin or the same compound of the encapsulation material 20)

FIG. 4K—flipping of wafer

FIG. 4L—attachment of balls 24

FIG. 4M—singulation to define the package with its encapsulation body.

As noted in connection with FIG. 4I, formation of antennas 100 may involve resorting to conventional wire bonding technology using wires (e.g., 15 micron wires) of materials such as gold, aluminum or copper as conventional in wire bonding technology.

In brief, a semiconductor device (for instance, 10) as exemplified herein may comprise: one or more semiconductor chips (for instance, 14) coupled to a planar substrate (for instance, 12); and one or more rectilinear wire antennas (for instance, 100) extending along an antenna axis (for instance, X100) transverse thereto (for instance, orthogonal or substantially orthogonal to the substrate), the one or more rectilinear wire antennas electrically coupled (for instance, via the leadframe in FIGS. 1 and 2 or the redistribution layer in FIG. 3) to the one or more semiconductor chips.

In a semiconductor device as exemplified herein, the one or more rectilinear wire antennas may protrude from the planar substrate.

While not shown for the sake of brevity, it is again noted that in a semiconductor device as exemplified herein, one or more rectilinear wire antennas may be arranged on one or more semiconductor chips (e.g., by being bonded to pads available at the top or front surface thereof).

A semiconductor device as exemplified herein may comprise encapsulation material (for instance, 20 and, possibly 100B) encapsulating the one or more semiconductor chips coupled to the substrate as well as the one or more rectilinear wire antenna within an encapsulation body.

In a semiconductor device as exemplified herein, the one or more rectilinear wire antennas may be located sidewise (i.e., at a located offset from an outer peripheral edge) of the one or more semiconductor chips.

In a semiconductor device as exemplified herein, the one or more semiconductor chips may have a thickness in the direction of the antenna axis and one or more rectilinear wire antennas may have a length approximately equal or less than the thickness of the one or more semiconductor chips.

As used herein, "approximately" specifically takes into account the tolerances involved in producing and measuring the features considered and more generally means within (+/−) 1-5% of a nominal or design specified value.

In a semiconductor device as exemplified herein, the planar substrate may comprise a leadframe including a die pad (for instance, 12A in FIGS. 1 and 2) having one or more semiconductor chips or dice arranged thereon as well as an array of leads (for instance, 12B in FIGS. 1 and 2) around the die pad, wherein the one or more rectilinear wire antennas are provided at said array of leads.

In a semiconductor device as exemplified herein, the planar substrate may comprise a redistribution layer (see, for instance, FIG. 3) provided at said one or more semiconductor chips to facilitate electrical contact of the semiconductor chip(s) with an array of contact formations (for instance, 24), wherein the one or more rectilinear wire antennas and the array of contact formations are located on opposite sides of the redistribution layer.

A method as exemplified herein may comprise: providing one or more semiconductor chips (for instance, 14) coupled to a planar substrate (for instance, 12); and providing one or more rectilinear wire antennas (for instance, 100) extending along an antenna axis (for instance, X100) transverse to the planar substrate, the one or more rectilinear wire antennas electrically coupled to the at least one semiconductor chip.

A method as exemplified herein may comprise bonding the one or more rectilinear wire antennas to the planar substrate, wherein the one or more rectilinear wire antennas protrude from the planar substrate.

A method as exemplified herein may comprise providing encapsulation material (for instance 20 and, possibly 100B) encapsulating the one or more semiconductor chips coupled to the substrate, wherein the encapsulation material encapsulates the semiconductor chip(s) coupled to the substrate as well as the rectilinear wire antenna(s).

A method as exemplified herein may comprise: providing (see, for instance, FIGS. 4C to 4G) a mass of encapsulation material (20) for the one or more semiconductor chips coupled to the planar substrate (12); forming (see, laser drilling as exemplified by LB in FIG. 4H) in the mass of encapsulation material at least one cavity (for instance, 100A), extending (e.g., to the planar substrate) along said antenna axis through the encapsulation material; and bonding (e.g., to the planar substrate) at the bottom of the at the least one cavity a rectilinear wire antenna (for instance, 100) (e.g., protruding from the planar substrate) extending in said at least one cavity formed in the mass of encapsulation material.

A method as exemplified herein may comprise bonding the rectilinear wire antenna to the planar substrate at the bottom of the at least one cavity, optionally by ball-plus-wire bonding wire material at the bottom at the least one cavity.

A method as exemplified herein may comprise filling insulating encapsulation material (for instance, 100B) into the at least one cavity having the rectilinear wire antenna extending therein.

Without prejudice to the underlying principles, the details and embodiments may vary, even significantly, with respect to what has been described by way of example only without departing from the extent of protection.

The claims are an integral part of the technical teaching on the embodiments as provided herein.

The extent of protection is determined by the annexed claims.

The invention claimed is:

1. A device, comprising:
a planar substrate having a first main surface;
a semiconductor chip mounted to said first main surface of the planar substrate;
first encapsulation material forming an encapsulation body that encapsulates the semiconductor chip coupled to the planar substrate, said encapsulation body including a cavity extending through the encapsulation body to the planar substrate;
a rectilinear wire antenna mounted within the cavity; wherein said rectilinear wire antenna has an antenna axis that extends transverse to the first main surface of the planar substrate;
wherein said rectilinear wire antenna is electrically coupled to the semiconductor chip; and
a second encapsulation material filling said cavity to encapsulate the rectilinear wire antenna.

2. The device of claim 1, wherein the rectilinear wire antenna protrudes from the planar substrate.

3. The device of claim 1, wherein the rectilinear wire antenna is mounted to the planar substrate at a location offset from an outer peripheral edge of the semiconductor chip.

4. The device of claim 1, wherein the semiconductor chip has a thickness in a direction of the antenna axis and the rectilinear wire antenna has a length in the direction of the antenna axis that is equal to or less than the thickness of the semiconductor chip.

5. The device of claim 1, wherein the semiconductor chip is electrically connected to the planar substrate by bonding wires.

6. The device of claim 1, wherein the semiconductor chip is electrically connected to the planar substrate by pillars.

7. The device of claim 1, wherein the planar substrate is formed by a leadframe having a die pad to which the semiconductor chip is mounted, and further having a plurality of leads extending away from the die pad, where the rectilinear wire antenna is mounted to, and electrically connected to, one lead of said plurality of leads.

8. The device of claim 1, wherein the planar substrate is formed by a redistribution layer including at least one insulating layer and at least one conductive layer patterned to form a plurality of redistribution leads, where the rectilinear wire antenna is mounted to, and electrically connected to, one redistribution lead of said plurality of redistribution leads.

9. The device of claim 1, wherein the planar substrate comprises a leadframe including a die pad having the semiconductor chip arranged thereon as well as an array of leads around the die pad, wherein the rectilinear wire antenna is coupled to one lead of said array of leads.

10. The device of claim 1, wherein the planar substrate comprises a redistribution layer provided on said semiconductor chip to facilitate electrical contact of the semiconductor chip with an array of contact formations at a second main surface of the planar substrate, wherein the rectilinear wire antenna is mounted at a first side of the redistribution layer and wherein the array of contact formations are located at a second side of the redistribution layer opposite the first side.

11. The device of claim 10, wherein the redistribution layer includes a redistribution lead having a surface at the first side, and wherein said rectilinear wire antenna is mounted to, and electrically connected to, said surface of the redistribution lead at the first side.

12. A method, comprising:
mounting a semiconductor chip to a first main surface of a planar substrate;
encapsulating the semiconductor chip within an encapsulation body coupled to the planar substrate;
forming a cavity extending through the encapsulation body to the planar substrate;
mounting a rectilinear wire antenna within the cavity; wherein said rectilinear wire antenna has an antenna axis extending transverse to the first main surface of the planar substrate;
electrically coupling the rectilinear wire antenna to the semiconductor chip; and
filling said cavity with a second encapsulation material to encapsulate the rectilinear wire antenna.

13. The method of claim 12, comprising bonding the rectilinear wire antenna to the planar substrate, wherein the rectilinear wire antenna protrudes from the first main surface of the planar substrate.

14. The method of claim 12, further comprising forming electrical contacts at a second main surface of the planar substrate which is opposite the first main surface.

15. The method of claim 12, wherein the rectilinear wire antenna is mounted to the planar substrate at a location offset from an outer peripheral edge of the semiconductor chip.

16. The method of claim 12, wherein the semiconductor chip has a thickness in a direction of the antenna axis and the rectilinear wire antenna has a length in the direction of the antenna axis that is equal to or less than the thickness of the semiconductor chip.

17. The method of claim 12, further comprising electrically connecting the semiconductor chip to the planar substrate by bonding wires.

18. The method of claim 12, further comprising electrically connecting the semiconductor chip to the planar substrate by pillars.

19. The method of claim 12, wherein the planar substrate is formed by a leadframe.

20. The method of claim 12, wherein the planar substrate is formed by a redistribution layer.

21. A method, comprising:
coupling a semiconductor chip to a planar substrate;
providing a mass of encapsulation material to encapsulate the semiconductor chip coupled to the planar substrate;
forming a cavity that extends through the mass of encapsulation material along a direction of an antenna axis;
bonding a rectilinear wire antenna at a bottom of the cavity; and
filling the cavity with an insulating material that encapsulates the rectilinear wire antenna.

22. The method of claim 21, wherein bonding the rectilinear wire antenna is implemented by ball-plus-wire bonding wire material at the bottom at the cavity.

23. The method of claim 21, further comprising forming electrical contacts at a second main surface of the planar substrate which is opposite the first main surface.

24. The method of claim 21, wherein said rectilinear wire antenna has the antenna axis extending within said cavity, and wherein the semiconductor chip has a thickness in a direction of the antenna axis and the rectilinear wire antenna has a length in the direction of the antenna axis that is equal to or less than the thickness of the semiconductor chip.

25. The method of claim 21, further comprising electrically connecting the semiconductor chip to the planar substrate by bonding wires.

26. The method of claim 21, further comprising electrically connecting the semiconductor chip to the planar substrate by pillars.

27. The method of claim 21, wherein the planar substrate is formed by a leadframe.

28. The method of claim 21, wherein the planar substrate is formed by a redistribution layer.

* * * * *